(12) United States Patent
Mori

(10) Patent No.: US 7,095,271 B2
(45) Date of Patent: Aug. 22, 2006

(54) BIAS CIRCUIT

(75) Inventor: Hiroyuki Mori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 455 days.

(21) Appl. No.: 10/670,224

(22) Filed: Sep. 26, 2003

(65) Prior Publication Data
US 2006/0061408 A1 Mar. 23, 2006

Related U.S. Application Data

(60) Provisional application No. 60/413,951, filed on Sep. 27, 2002.

(51) Int. Cl.
*G05F 1/10* (2006.01)

(52) U.S. Cl. .................. 327/541; 327/540; 323/316

(58) Field of Classification Search ........... 327/540, 327/541, 543, 546; 323/315, 316
See application file for complete search history.

(56) References Cited

U.S. PATENT DOCUMENTS 5,933,051 A * 8/1999 Tsuchida et al. .......... 327/543
6,133,719 A * 10/2000 Maulik .................... 323/313
6,563,371 B1 * 5/2003 Buckley et al. ........... 327/539
6,844,772 B1 * 1/2005 Hoon et al. .............. 327/541
2004/0150381 A1 * 8/2004 Butler ...................... 323/313

* cited by examiner

Primary Examiner—Terry D. Cunningham

(57) ABSTRACT

A bias circuit includes a feedback amplifier, a current source, first and second differential transistors, first and second resistive transistors and first and second mirror transistors. The feedback amplifier compares a first reference voltage with a voltage on an internal node and outputs a feedback signal. The current source is controlled by the feedback signal. The first and second differential transistors are connected to the current source. The first and second differential transistors receive a second reference voltage. The second differential transistor has a dimension different from the first differential transistor. The first and second resistive transistors are connected to the first and second differential transistors respectively. The second resistive transistor has a first gate. Each of the first and second mirror transistors has a gate connected to the first gate. The first mirror transistor is connected to the internal node. The second mirror transistor is connected to an output node.

20 Claims, 3 Drawing Sheets

BIAS CIRCUIT

BACKGROUND OF THE INVENTION

The present invention relates to a bias circuit, and particularly to a bias circuit capable of outputting a bias current that depends on current amplification gains β of transistors and resistance values without depending on the accuracy of a required reference voltage.

A conventional bias circuit comprises an NMOS transistor for constant current source (hereinafter called "a constant current source transistor") 2 whose constant current value is controlled based on the output of a feedback amplifier, a differential pair of NMOS transistors (hereinafter called "differential transistors") equal in dimension from each other, which is connected to the drain of the constant current source transistor, diode-connected load PMOS transistors (hereinafter called "load transistors") respectively connected to the drains of the differential transistors, current mirror PMOS transistors (hereinafter called "mirror transistors") which constitute the load transistor and a current mirror, and a resistor 9 which receives a current that flows through the mirror transistor. The drain side of the mirror transistor serves as a current output terminal.

Different reference voltages are respectively applied to the gates of the differential transistors, and another reference voltage is further applied to a positive input terminal of the feedback amplifier.

When, for example, the differential transistors are increased in current amplification gain β due to variations in manufacture in such a bias circuit, the feedback amplifier controls a current flowing through the constant current source transistor so as to be reduced. Accordingly, the mirror transistor outputs an output current that depends on the current amplification gains β of the differential transistors and the resistance value of the resistor.

The conventional bias circuit is accompanied by a problem that the accuracy of the reference voltages applied to the differential transistors is degraded, and when an input potential difference varies, the output current also varies eventually.

SUMMARY OF THE INVENTION

The present invention may provide a bias circuit capable of outputting an output current which does not depend on the accuracy of each reference voltage.

The bias circuit of the present invention comprises a current source MOS transistor, a differential MOS transistor pair for dividing a current flowing through the current source MOS transistor on a differential basis, load MOS transistors that respectively receive respective one currents flowing through the differential MOS transistors, current mirror MOS transistors constituting the load MOS transistor and a current mirror, a first resistive element for converting a current flowing through the current mirror MOS transistor into a voltage, and an amplifier for controlling the current source MOS transistor in such a manner that the voltage converted by the first resistive element becomes a second reference voltage.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
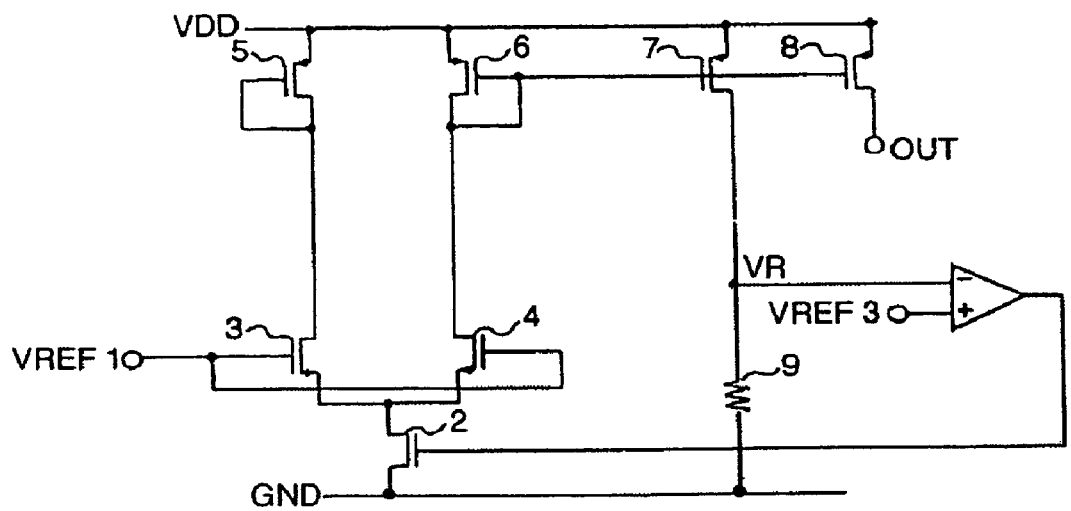
FIG. 1 shows a bias circuit according to a first embodiment of the present invention.

FIG. 1 shows a bias circuit according to a first embodiment of the present invention.

The bias circuit according to the first embodiment of the present invention comprises an NMOS transistor for constant current source (hereinafter called "a constant current source transistor") 2 whose constant current value I2 is controlled based on the output of a feedback amplifier 1, a differential pair of NMOS transistors (hereinafter called "differential transistors") 3 and 4 different in dimension from each other, which is connected to the drain of the constant current source transistor 2, diode-connected load PMOS transistors (hereinafter called "load transistors") 5 and 6 respectively connected to the drains of the differential transistors 3 and 4, current mirror PMOS transistors (hereinafter called "mirror transistors") 7 and 8 which constitute the load transistor 6 and a current mirror, and a resistor 9 which receives a current that flows through the mirror transistor 7. The drain side of the mirror transistor 8 serves as a current output terminal OUT.

A point VR where the drain of the mirror transistor 7 and the resistor 9 are connected to each other, is connected to a negative input terminal of the feedback amplifier 1.

Assuming that the dimensions of the differential transistors 3 and 4 are represented as, for example: W/L of differential transistor 3: W/L of differential transistor 4=1: N (where N is an integer greater than or equal to 2), it makes it easy to realize the bias circuit according to the present embodiment.

The operation of the bias circuit according to the first embodiment of the present invention will next be described. As distinct from the conventional bias circuit, no input potential difference ΔV exists in the bias circuit according to the first embodiment of the present invention. However, the dimensions of the differential transistors 3 and 4 are made different to thereby make it possible to cause a difference input voltage to generate an offset. Eventually, a differential input voltage ΔV' occurs between a gate voltage of the differential transistor 3 and a gate voltage of the differential transistor 4, whereby the present bias circuit performs an operation equivalent to that of the conventional bias circuit.

Namely, a current I4 that flows through the differential transistor 4 is represented as follows:

$$I4=I2/2-(\beta/4 \cdot W/L)\Delta V'\{(2 \cdot I2)/(\beta/2 \cdot W/L) - \Delta V'^2\} \qquad (2)$$

Incidentally, the introduction of above equation (2) will be explained in detail.

$$I3 = (\beta/2 \cdot W/L) \cdot (Vgs3 - Vt)^2 \quad (a)$$

$$I4 = (\beta/2 \cdot W/L) \cdot (Vgs4 - Vt)^2 \quad (b)$$

$$I3 + I4 = 2Id \quad (c)$$

$$I3 - I4 = \Delta Id \quad (d)$$

Finding the square root of (a) and (b) and subtracting both from each other results in the following equation:

$$\sqrt{I3} - \sqrt{I4} = (\beta/2 \cdot W/L) \cdot \Delta V^2 \quad (e)$$

Raising (c) and (d) to the second power and subtracting both from each other results in the following equation:

$$2 \cdot (I3 - I4) = \{(2Id)^2 - \Delta Id^2\} \quad (f)$$

Raising (e) to the second power and substituting (f) therein results in the following equation:

$$\Delta Id = (\beta/2 \cdot W/L)\Delta V^2 \cdot \{(2 \cdot I2)/(\beta/2 \cdot W/L) - \Delta V^2\} \quad (g)$$

Taking (c)–(d) results in the following equation:

$$I4 = Id - \Delta Id/2 \quad (h)$$

Since $2Id = I2$ in the present embodiment, (h) is rewritten as follows:

$$I4 = I2/2 - \Delta Id/2 \quad (i)$$

Eventually, the equation (i) is rewritten as follows:

$$I4 = I2/2 - (\beta/4 \cdot W/L)\Delta V^2 \cdot \{(2 \cdot I2)/(\beta/2 \cdot W/L) - \Delta V^2\} \quad (j)$$

The current of the mirror transistor 7 is represented as I7=I4, and the potential at the connecting point VR is represented as Vr=R·I4. The feedback amplifier 1 controls the current I2 of the constant current source transistor so that the VR reaches VREF3.

Also the feedback amplifier 1 controls the current I12 of the constant current source transistor such that the potential Vr at the connecting point VR reaches VREF3.

Further, when the current amplification gains β of the differential transistors 3 and 4 become large due to variations in manufacture or the like, for example, I3 and I4 also increase. With their current increases, the potential Vr at the connecting point VR also becomes high. Therefore, the feedback amplifier 1 controls the current I2 of the constant current source transistor 2 as small as practicable to lower the potential Vr so as to reach Vr=VREF3. Consequently, the mirror transistor 8 outputs an output current I8 that depends on the current amplification gains β of the differential transistors 3 and 4 and the resistance value of the resistor 9.

As described above, the bias circuit according to the first embodiment of the present invention makes the dimensions of differential transistors different and applies the same reference voltage to their gates, thereby making it possible to output an output current that depends on the current amplification gains β of transistors and the resistance value without depending on the accuracy of the reference voltage.

Figure 2:
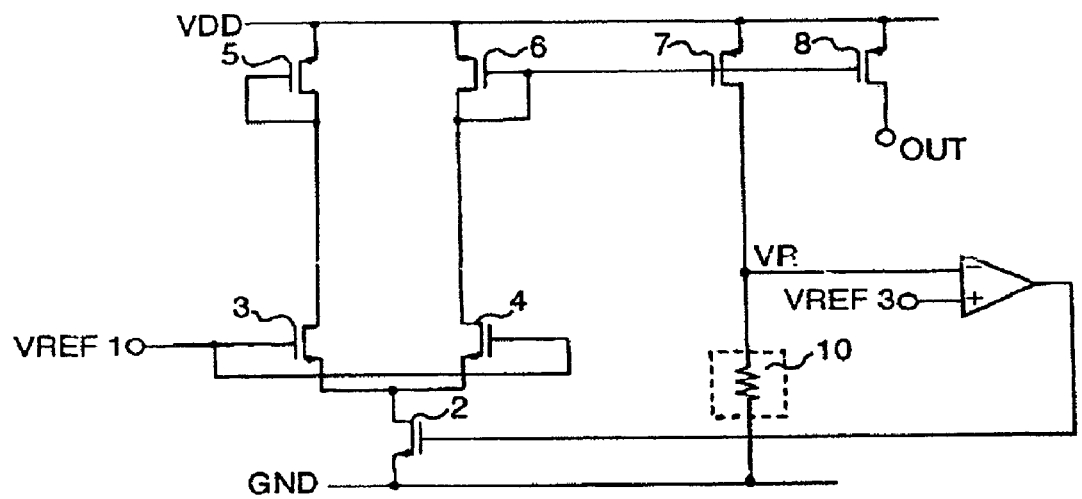
FIG. 2 illustrates a bias circuit according to a second embodiment of the present invention.

FIG. 2 illustrates a bias circuit according to a second embodiment of the present invention.

The bias circuit according to the second embodiment of the present invention has a configuration wherein the resistor 9 employed in the bias circuit according to the first embodiment is substituted with a so-called external resistor 10 external to the outside of a semiconductor chip.

The absolute resistance value of the resistor 9 lying within the semiconductor chip varies according to variations in manufacture (about ±10% in general).

Since the accuracy of the absolute resistance value of the external resistor 10 is generally about ±1%, the dependence of an output current I8 on the resistance value can be significantly suppressed owing to the use of such an external resistor. The utilization of the external resistor is particularly effective for a case in which the output current I8 is needed which depends only on current amplification gains β of differential transistors 3 and 4.

In a manner similar to the bias circuit according to the first embodiment, the bias circuit according to the second embodiment of the present invention as described above makes the dimensions of differential transistors different and applies the same reference voltage to their gates, thereby making it possible to output an output current that depends only on current amplification gains β of transistors without depending on the accuracy of the reference voltage.

Figure 3:
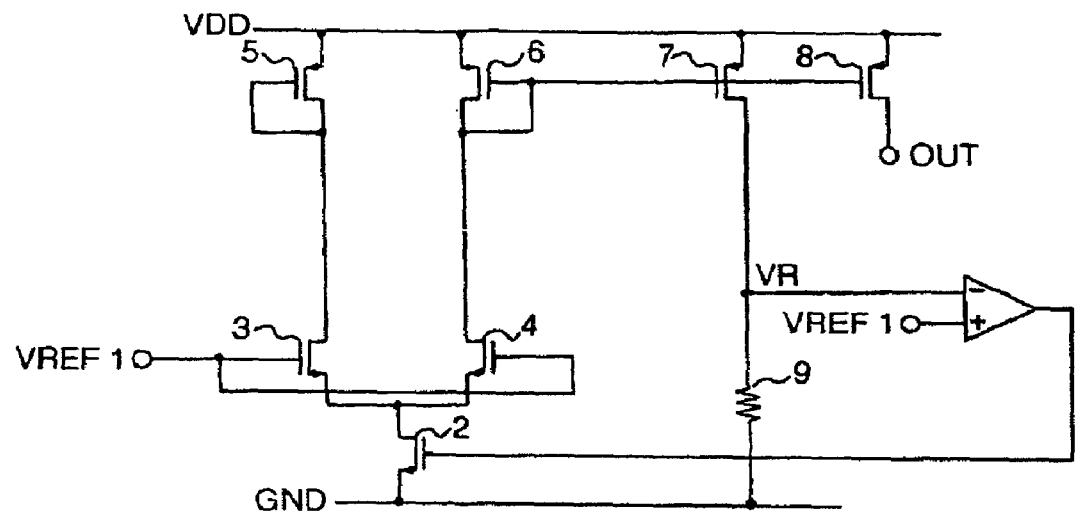
FIG. 3 depicts a bias circuit according to a third embodiment of the present invention.

FIG. 3 shows a bias circuit according to a third embodiment of the present invention.

The bias circuit according to the second embodiment of the present invention has a configuration wherein the reference voltage VREF3 employed in the bias circuit according to the first embodiment is substituted with VREF1.

Thus, the number of reference voltages necessary for the bias circuit according to the third embodiment may be one, and hence the bias circuit becomes apt to be realized.

In addition to the advantageous effect of the bias circuit according to the first embodiment, the bias circuit according to the third embodiment of the present invention as described above makes identical a reference voltage of a feedback amplifier and a reference voltage for differential transistors to thereby allow the required number of reference voltages to be set to one. It is thus possible to make it easy to realize a bias circuit.

Figure 4:
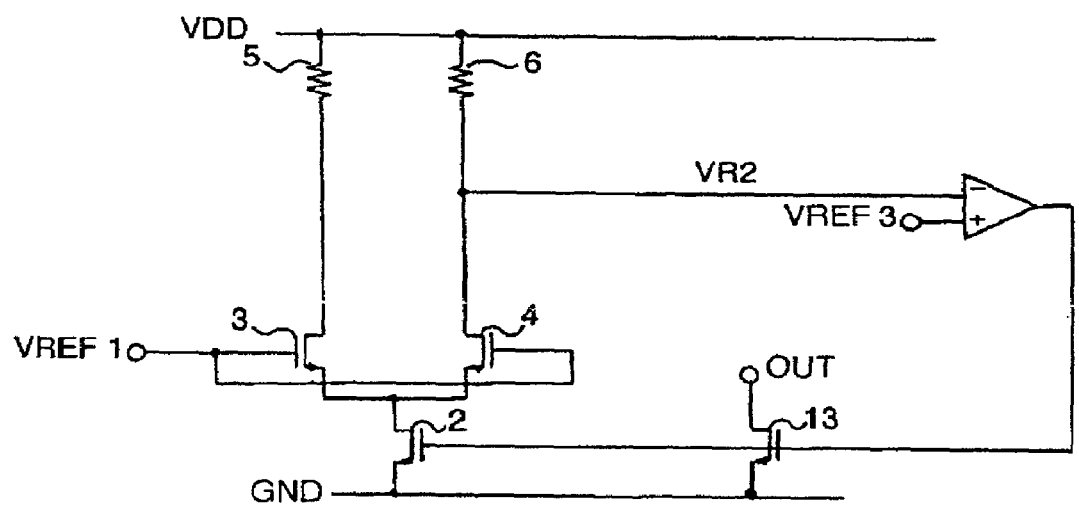
FIG. 4 shows a bias circuit according to a fourth embodiment of the present invention.

FIG. 4 shows a bias circuit according to a fourth embodiment of the present invention.

The bias circuit according to the fourth embodiment of the present invention comprises an NMOS transistor for constant current source (hereinafter called "a constant current source transistor") 2 whose constant current. value I2 is controlled based on the output of a feedback amplifier 1, a differential pair of NMOS transistors (hereinafter called "differential transistors") 3 and 4 equal in dimension from each other, which is connected to the drain of the constant current source transistor 2, load resistors 5 and 6 respectively connected to the drains of the differential transistors 3 and 4, and a mirror transistor 13 which is controlled in accordance with the output of the feedback amplifier 1 in a manner similar to the constant current source transistor 2 and whose drain side serves as a current output terminal.

In a manner similar to the first embodiment, a reference voltage VREF1 is applied to the gates of the differential transistors 3 and 4, and VREF3 is applied to a positive input terminal of the feedback amplifier 1.

A point where the drain of the differential transistor 4 and the resistor 6 are connected to each other, is set as VR2 and connected to a negative input terminal of the feedback amplifier 1.

The other terminals of the load resistors 5 and 6 are both connected to VDD.

In a manner similar to the first embodiment, a current I4 that flows through the differential transistor 4 is expressed in the above equation (2), and a current that flows through the load resistor 6 is equal to that of the differential transistor 4. Eventually, the potential at the connecting point VR2 results in Vr2=VDD−R·I4.

The feedback amplifier 1 controls the current I2 of the constant current source transistor so that the potential Vr2 becomes VREF3. Eventually, the mirror transistor 13 outputs an output current I13 that depends on the current amplification gains β of the differential transistors 3 and 4, the resistance value of the resistor 6 and VDD.

In addition to the advantageous effect of the bias circuit according to the first embodiment, the bias circuit according to the fourth embodiment of the present invention as described above makes use of resistors whose one ends are connected to VDD, thereby making it possible to output an output current that depends on current amplification gains β of transistors, resistance values and VDD without the accuracy of a reference voltage.

Figure 5:
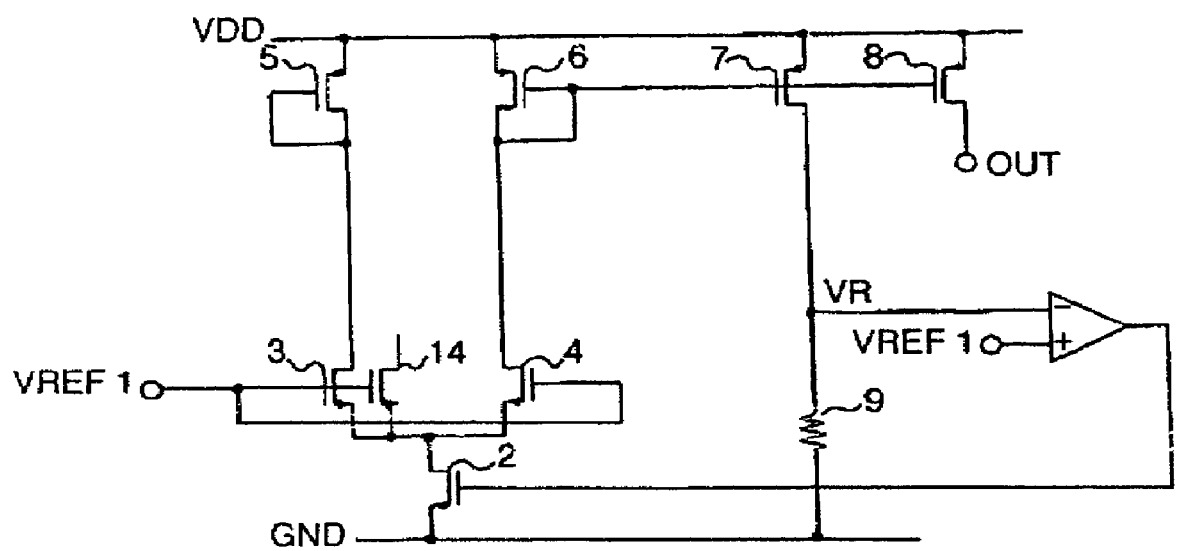
FIG. 5 illustrates a bias circuit according to a fifth embodiment of the present invention.

FIG. 5 shows a bias circuit according to a fifth embodiment of the present invention.

The bias circuit according to the fifth embodiment of the present invention has a configuration wherein a dummy transistor 14 is provided in addition to the differential transistors 3 and 4 employed in the bias circuit according to the first embodiment.

The source of the dummy transistor 14 is connected to the drain of a constant current source transistor 2 but the drain thereof is being floated. Also a reference voltage VREF1 is applied to the gate of the dummy transistor 14 in a manner similar to the differential transistors 3 and 4.

Since the differential transistors 3 and 4 are different in dimension when the bias circuit of the present invention is laid out, there is a possibility that matching accuracy will be degraded.

Therefore, the dummy transistor 14 is placed on the differential transistor 3 side small in dimension, and the differential transistors 3 and 4 and the dummy transistor 14 are laid out symmetrically.

It is thus possible to reduce a production mismatch between the differential transistors 3 and 4 and to obtain an output current I8 less reduced in variation from a mirror transistor 8.

As described above, the bias circuit according to the fifth embodiment of the present invention adds a dummy transistor to the differential transistor employed in the bias circuit according to the first embodiment, thereby making it possible to reduce a manufacturing mismatch between the differential transistors and obtain an output current that depends on current amplification gain β of each transistor small in variation, and a resistance value.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A bias circuit comprising:
   an output node for outputting an output current;
   an internal node;
   a feedback amplifier comparing a first reference voltage with a voltage on the internal node and outputting a feedback signal;
   a current source controlled by the feedback signal;
   a first differential transistor connected to the current source, the first differential transistor receiving a second reference voltage;
   a second differential transistor connected to the current source, the second differential transistor receiving the second reference voltage, the second differential transistor having a dimension that is different from that of the first differential transistor;
   a first resistive transistor connected to the first differential transistor;
   a second resistive transistor connected to the second differential transistor, the second resistive transistor having a first gate;
   a first mirror transistor having a second gate connected to the first gate, the first mirror transistor connected to the internal node; and
   a second mirror transistor having a third gate connected to the first gate, the second mirror transistor connected to the output node.

2. A bias circuit according to claim 1, further comprising a resistor connected to the internal node.

3. A bias circuit according to claim 2, wherein the resistor is connected between the internal node and a first potential source.

4. A bias circuit according to claim 2, wherein the resistor is an external resistor.

5. A bias circuit according to claim 1, wherein the first and second reference voltage are the same voltage.

6. A bias circuit according to claim 1, further comprising a dummy differential transistor connected to the current source, the dummy differential transistor receiving the second reference voltage.

7. A bias circuit according to claim 1, wherein the current source has a current source transistor having a gate connected to the feedback amplifier, a drain connected to the first and second differential transistor and a source connected to a first potential source.

8. A bias circuit according to claim 1, wherein each of the first and second resistive transistors having a gate and a drain connected together and a source connected to a second potential source.

9. A bias circuit according to claim 1, wherein each of the first and second mirror transistors having a source connected to a second potential source.

10. A bias circuit comprising:
    an output node for outputting an output current;
    an internal node;
    a feedback amplifier comparing a first reference voltage with a voltage on the internal node and outputting a feedback signal;
    a current source controlled by the feedback signal;
    a first differential transistor connected between the internal node and the current source, the first differential transistor receiving a second reference voltage;
    a second differential transistor connected to the current source, the second differential transistor receiving the second reference voltage, the second differential transistor having a dimension that is different from that of the first differential transistor;
    a first resistive element connected to the internal node;
    a second resistive element connected to the second differential transistor; and
    an output transistor having a gate connected to receive the feedback signal and a drain connected to the output node.

11. A bias circuit according to claim 10, wherein the output transistor has a source connected to a first potential source.

12. A bias circuit according to claim 1, wherein the current source has a current source transistor having a gate connected to the feedback amplifier, a drain connected to the first and second differential transistor and a source connected to a first potential source.

13. A bias circuit according to claim 1, wherein the first and second resistive elements are connected to a second potential source.

14. A bias circuit comprising:

an output node outputting an output signal;

an internal node on which an internal voltage is applied;

a feedback amplifier comparing a first reference voltage with the internal voltage;

a current source connected to a first potential source, the current source providing a constant current in response to the feedback signal;

a first differential transistor connected to the current source, the first differential transistor receiving a second reference voltage;

a second differential transistor connected to the current source, the second differential transistor receiving the second reference voltage, the second differential transistor having a dimension that is different from that of the first differential transistor;

a first resistive transistor connected between the first differential transistor and a second potential source;

a second resistive transistor connected between the second differential transistor and the second potential source, the second resistive transistor having a first gate;

a first mirror transistor having a second gate connected to the first gate, the first mirror transistor connected between the internal node and the second potential source; and a second mirror transistor having a third gate connected to the first gate, the second mirror transistor connected between the output node and the second power source.

15. A bias circuit according to claim 14, further comprising a resistor connected between the internal node and the first potential source.

16. A bias circuit according to claim 14, wherein the resistor is an external resistor.

17. A bias circuit according to claim 14, wherein the first and second reference voltage are the same voltage.

18. A bias circuit according to claim 14, further comprising a dummy differential transistor connected to the current source, the dummy differential transistor receiving the second reference voltage.

19. A bias circuit according to claim 1, wherein the current source has a current source transistor having a gate connected to the feedback amplifier, a drain connected to the first and second differential transistors and a source connected to the first potential source.

20. A bias circuit according to claim 14, wherein each of the first and second resistive transistors having a gate and a drain connected together and a source connected to the second potential source.

* * * * *